United States Patent [19]

Tanaka

[11] Patent Number: 5,140,384
[45] Date of Patent: Aug. 18, 1992

[54] SEMICONDUCTOR LASER DEVICE MOUNTED ON A STEM

[75] Inventor: Haruo Tanaka, Shiga, Japan

[73] Assignee: Rohm Co., Ltd., Kyoto, Japan

[21] Appl. No.: 686,146

[22] Filed: Apr. 16, 1991

[30] Foreign Application Priority Data

| Jun. 14, 1990 | [JP] | Japan | 2-156203 |
| Jun. 14, 1990 | [JP] | Japan | 2-156204 |
| Jun. 14, 1990 | [JP] | Japan | 2-156205 |
| Jun. 14, 1990 | [JP] | Japan | 2-156207 |

[51] Int. Cl.$^5$ .................................. H01L 33/00
[52] U.S. Cl. ............................. 357/17; 357/19; 357/72; 357/74; 357/75
[58] Field of Search ............ 357/17, 19, 72, 74, 357/74 R, 74 A, 74 B, 74 C, 74 F, 75, 79, 76

[56] References Cited

U.S. PATENT DOCUMENTS

| 4,432,131 | 2/1984 | Sadamasa et al. | 357/72 X |
| 4,768,070 | 8/1988 | Takizawa et al. | 357/17 |
| 4,945,391 | 7/1990 | Yagoura et al. | 357/30 R X |

FOREIGN PATENT DOCUMENTS

| 56-142657 | 11/1981 | Japan | 357/72 |
| 58-145149 | 8/1983 | Japan | 357/72 |
| 61-23345 | 1/1986 | Japan | 357/72 |
| 62-58066 | 4/1987 | Japan | . |
| 62-88345 | 4/1987 | Japan | 357/72 |
| 63-129680 | 6/1988 | Japan | 357/72 |
| 1-137655 | 5/1989 | Japan | 357/72 |

OTHER PUBLICATIONS

Dion et al., "Module Package", *IBM Technical Disclosure Bulletin*, vol. 7, No. 7, Dec. 1964, p. 55.

*Primary Examiner*—William Mintel
*Attorney, Agent, or Firm*—William H. Eilberg

[57] ABSTRACT

The present invention provides a semiconductor laser device which comprises a stem, a cap mounted to the stem, and a semiconductor laser chip carried by the stem within the cap. The laser chip is covered by a protective body which is made of a transparent synthetic resin, preferably a relatively soft resin such as silicone resin. The protective body prevents the laser chip from being adversely affected by moisture and/or dust even if external air gets into the cap. The protective body may be further covered by a second protective body which is made of a relatively hard resin such as epoxy resin.

17 Claims, 8 Drawing Sheets

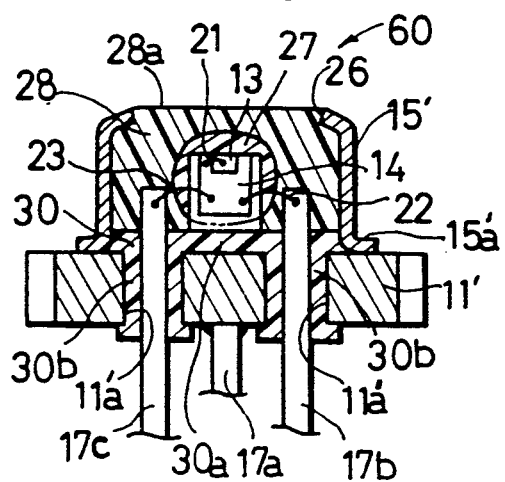
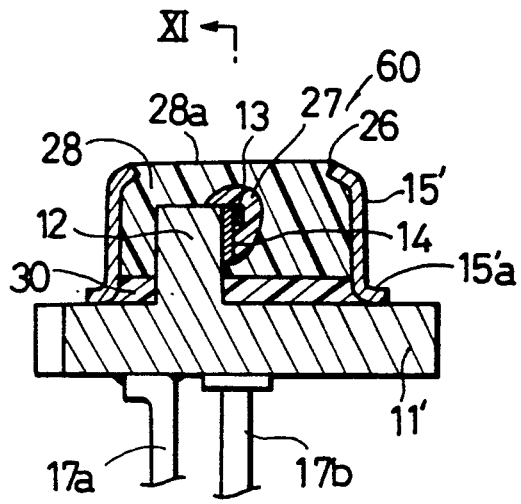
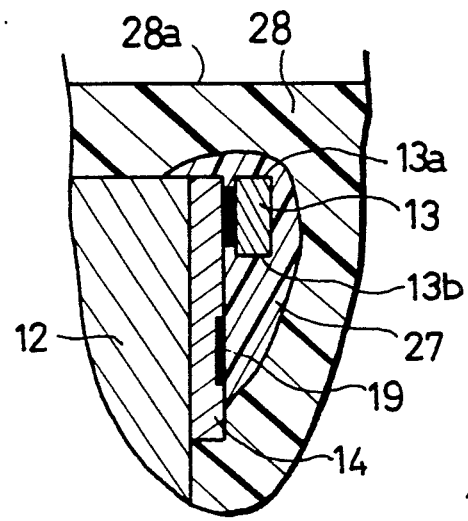
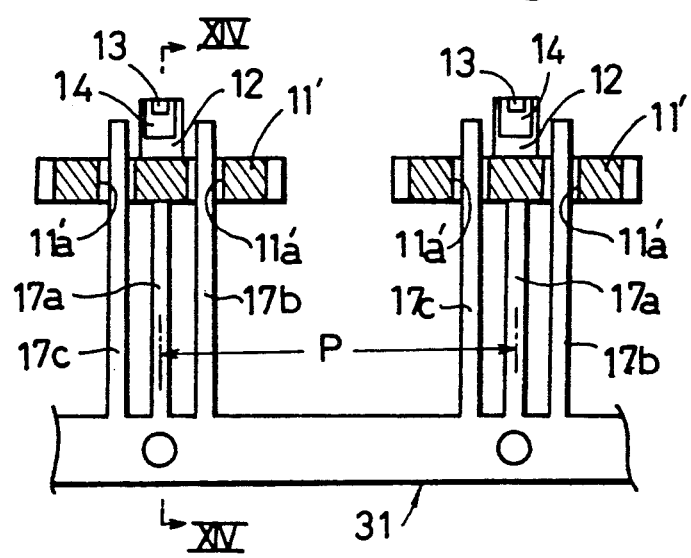

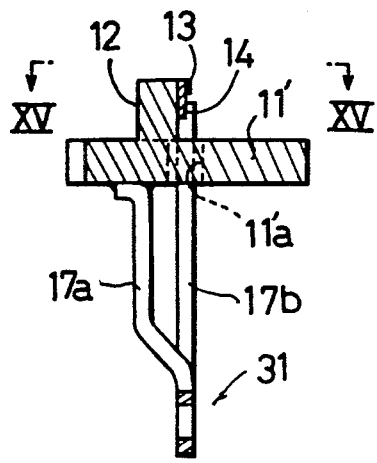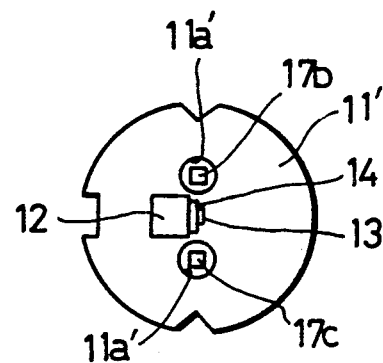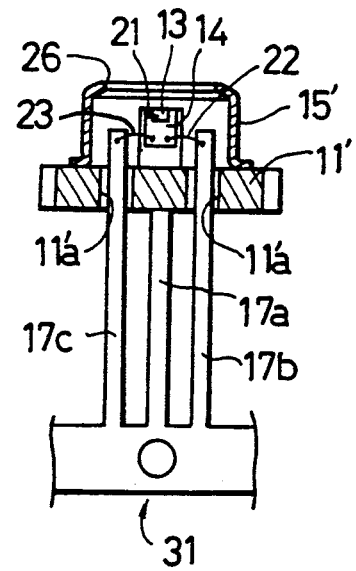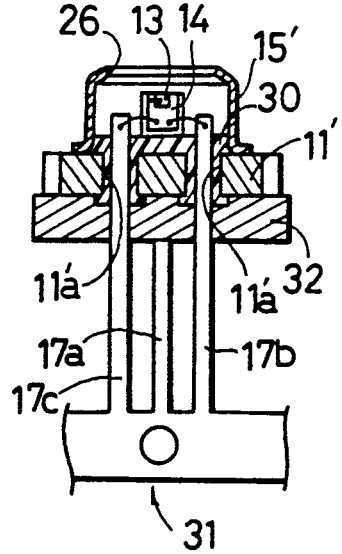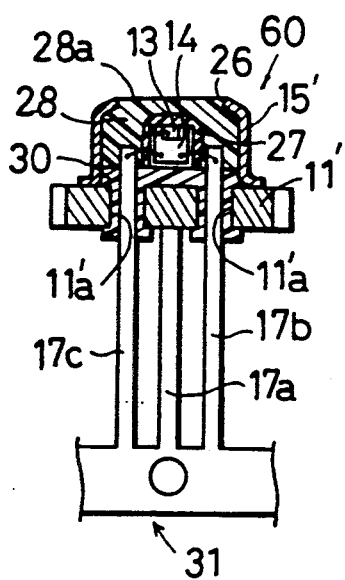

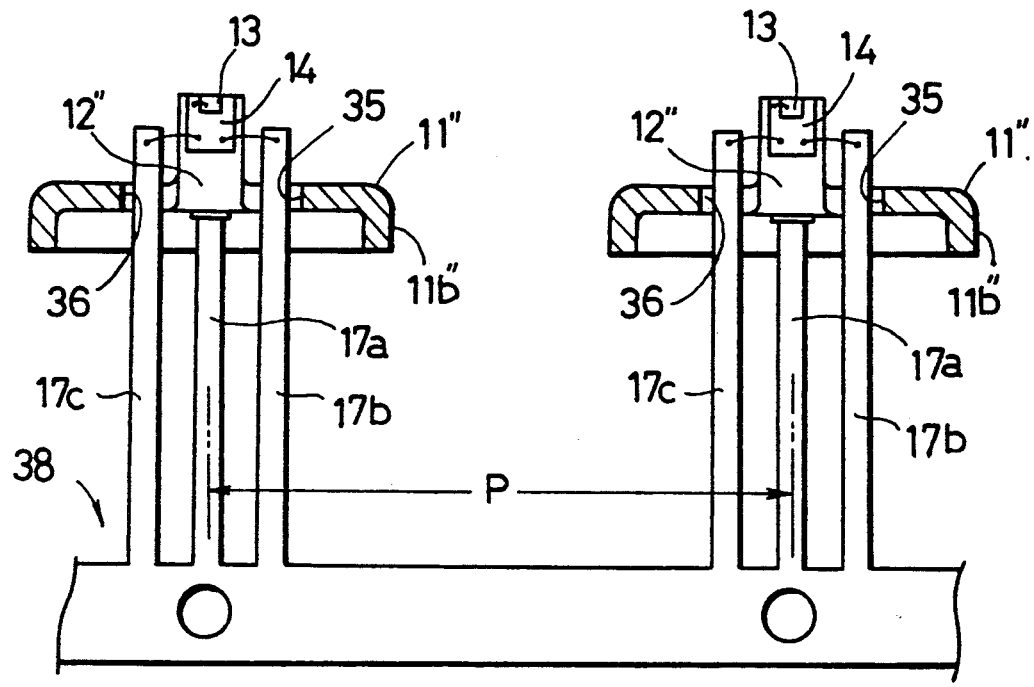
Fig. 24
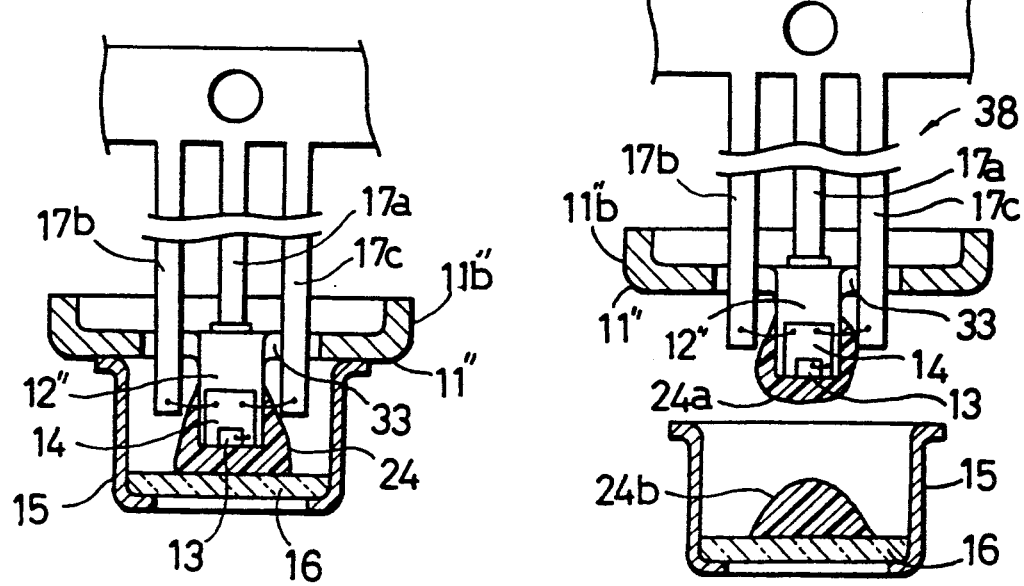
Fig. 26
Fig. 25

SEMICONDUCTOR LASER DEVICE MOUNTED ON A STEM

BACKGROUND OF THE INVENTION

1. Field of the Invention

This invention relates generally to a solid-state laser device. More particularly, the present invention relates to a semiconductor laser device of the type which utilizes a semiconductor laser chip hermetically encased in a cap.

2. Description of the Prior Art

Various semiconductor laser devices have been heretofore proposed. One typical example of these is the one which incorporates a semiconductor laser chip hermetically encased in a cap. The cap serves to protect the laser chip against adverse influences which may be caused by environmental moisture and/or dust. The cap also protects the laser chip against shocks and/or contact with external objects.

The capped semiconductor laser device is disclosed for example in U.S. Pat. No. 4,768,070 (Patented: Aug. 30, 1988; Applicant: Takizawa et al) or in Japanese Utility Model Application Laid-open No. 62-58066 (Laid-open: Apr. 10, 1987; Inventor: Toshiyiko Ishii). Reference is now made to FIGS. 31 through 33 of the accompanying drawings to specifically describe the prior art arrangement of such a laser device.

As shown in FIGS. 31 through 33, the typical prior art semiconductor laser device includes a discal base or stem 1 of a suitable diameter D and thickness T. The stem is provided with an upwardly directed mounting block 2 for mounting a semiconductor laser chip 3 via a semiconductor substrate (submount) 4. The discal stem is made of a metal such as carbon steel, and works dually as a support and as a heat sink.

The stem 1 is formed, near the mounting block 2, with an inclined recess 9a for arranging a laser emission monitoring photodiode 9. The underside of the stem is welded to a first lead 7a in electrical conduction therewith. Further, the stem is formed with a pair of lead inserting holes 1a, 1b to allow insertion of second and third leads 7b, 7c. The second and third leads are hermetically insulated from the stem by insulating glass sealant 8 loaded into the respective lead inserting holes.

As shown in FIG. 32, the laser chip 3 is connected to the substrate 4 by a wire A, while the substrate 4 is connected to the second lead 7b by another wire B. Similarly, the third lead 7c is connected to the photodiode 9 by a further wire C.

The laser device further comprises a cap 5 having a glass window plate 6 and mounted to the stem 1 to encase the semiconductor laser chip 3 and its associated components. The cap is also made of a metal such as carbon steel, and hermetically attached to the stem 1 by performing resistance welding. The glass window plate 6 is hermetically attached to the cap by using glass solder.

In operation, when a predetermined current is passed, the semiconductor laser chip 3 generates a laser beam in the arrow direction (FIG. 11) by stimulated emission. Simultaneously, a portion of the laser beam is emitted in the opposite direction and detected by the photodiode 9 for monitoring the laser beam emission.

The prior art laser device described above has the following technical problems.

PROBLEM 1

As already described, the glass window plate 6 is hermetically attached to the cap 5 by using glass solder. For this purpose, a glass solder ring (not shown) is first prepared by compacting glass powder into a ring form and subsequently heat-treating the compacted glass powder. The glass solder ring is then interposed between the cap 5 and the window plate 6, and thereafter caused to melt at a high temperature of 500°-600° C. Such a method is specifically described in Japanese Utility Model Application Laid-open No. 62-58066.

Apparently, various process steps are required for hermetical attachment of the window plate 6. Particularly troublesome is the fact that the metallic cap 5 is thermally affected adversely due to high-temperature treatment, consequently necessitating aftertreatments which include acid-washing and nickel-plating of the cap. Further, such aftertreatments require an additional step of coating the glass window plate 6 with a protective layer to protect against any damage during the aftertreatments. Thus, it is inevitably costly to manufacture the prior art laser device.

PROBLEM 2

According to the prior art arrangement, the second and third leads 7b, 7c are insulated from the stem 1 by the glass sealant 8 loaded in the respective lead inserting holes 1a, 1b of the stem. Obviously, for loading of the glass sealant, it is necessary to prepare glass solder pipes which are subsequently melted at a high temperature, consequently requiring aftertreatments. Thus, the provision of the glass sealant 8 also adds to the manufacturing cost of the prior art laser device.

PROBLEM 3

According to the prior art described above, the mounting block 2 may be formed in two different methods.

Specifically, in a first method, the mounting block 2 is separately prepared, and subsequently fixed to the stem 1 by welding or brazing. However, the first method is disadvantageous in that the mounting block is likely to deviate positionally and/or angularly during the welding or brazing operation. Thus, after welding or brazing, it may be necessary to perform additional finish machining until the chip bonding surface of the mounting block 2 is located correctly relative to the center of the stem 1 and maintains exact perpendicularity relative to the stem surface, thus resulting in an unacceptable cost increase.

In a second method, the mounting block 2 is formed integrally with the stem 1 simultaneously at the time of preparing the stem by cold-forging. While improving the positional and angular accuracy of the mounting block, the second method is still disadvantageous in that cold-forging of the combined stem and mounting block requires a strong high-precision forging machine but nevertheless results in early damage of forging dies, consequently causing an unacceptable cost increase.

Further, regardless of the method of forming the mounting block 2, the mounting block 2 provides an additional weight which cannot be canceled in the prior art arrangement.

SUMMARY OF THE INVENTION

It is, therefore, a primary object of the present invention is to provide a semiconductor laser device which eliminates or reduces Problem 1 described above.

Another object of the present invention is to provide a semiconductor laser device which is capable of eliminating or reducing Problems 1 and 2 at the same time.

A further object of the present invention is to provide a semiconductor laser device which can eliminate or reduce Problems 1 and 3 at the same time.

Still another object of the present invention is to provide a semiconductor laser device which can eliminate or reduce Problems 1 through 3 at the same time.

According to the present invention, there is provided a semiconductor laser device comprising: a stem; a cap mounted to the stem; and a semiconductor laser chip carried by the stem within the cap; the laser device further comprising a protective body arranged in the cap, the protective body being made of a transparent synthetic resin and entirely covering at least the laser chip.

According to a preferred embodiment, the laser device further comprises at least one lead penetrating into the cap through a lead inserting hole of the stem, and an insulating sealant member which is made of a thermosetting synthetic resin. The resinous sealant member fills the lead inserting hole around the lead, so that the resinous sealant instead of glass sealant firmly holds the lead in a sealingly insulated condition. It is advantageous that the sealant member contains calcium carbonate and/or alumina as additives because they are effective for preventing volumetric variation of the resinous sealant member during hardening thereof or during operation.

According to another preferred embodiment, the stem is made of a relatively thin metallic plate and integrally formed with a mounting block for carrying the laser chip, and the stem is also formed with a cutting line partially surrounding a portion of the stem, the mounting block being provided by bending the partially surrounded portion into the cap to leave a corresponding perforation in the stem, the laser device further comprising a closure means for closing the perforation on the side of the stem away from the cap. Advantageously, the stem has an annular portion directed away from the cap, and the closure means comprises a body of synthetic thermosetting resin loaded in the annular portion and perforation of the stem. Further advantageously, the protective body is relatively soft, and the thermosetting resin body for the closure means has a portion filling the cap outside the soft protective body to serve as a second protective body which is relatively hard.

Other objects, features and advantages of the present invention will be fully understood from the following detailed description given with reference to the accompanying drawings.

BRIEF DESCRIPTION OF THE DRAWINGS

In the accompanying drawings:

FIG. 10 is a side view, in vertical section, showing a semiconductor laser device according to a fourth embodiment of the present invention;

FIG. 11 is a sectional view taken along lines XI—XI in FIG. 10;

FIG. 12 is an enlarged fragmentary view illustrating principal parts of the laser device shown in FIG. 10;

FIG. 13 is a view showing a first process step of producing the laser device of FIG. 10;

FIG. 14 is a sectional view taken on lines XIV—XIV in FIG. 13;

FIG. 15 is a plan view as seen in the direction of arrows XV—XV in FIG. 14;

FIGS. 16 through 18 are views showing subsequent process steps of producing the laser device of FIG. 10;

FIGS. 24 through 26 are views showing process steps of producing the laser device of FIG. 19;

DETAILED DESCRIPTION OF THE PREFERRED EMBODIMENTS

Figure 1:
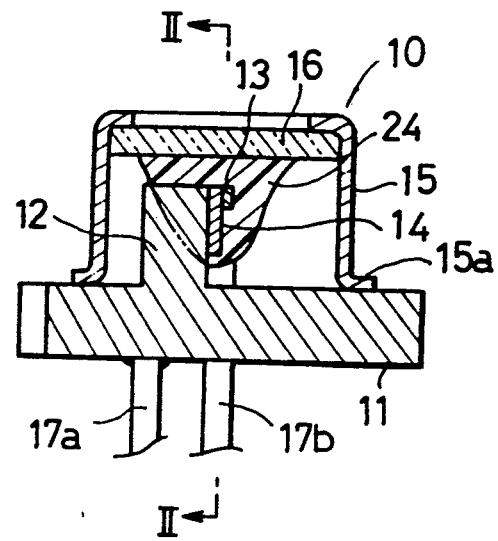
FIG. 1 is a side view, in vertical section, showing a semiconductor laser device according to a first embodiment of the present invention.

The present invention is now described on the basis of various preferred embodiments with reference to FIGS. 1 through 30 of the accompanying drawings. It should be noted that, throughout the different embodiments, identical or substantially identical parts are represented by the same reference numerals.

EMBODIMENT 1

FIGS. 1 through 4 show a semiconductor laser device according to the first embodiment of the present invention.

The laser device of this embodiment, which is generally designated by reference numeral 10, mainly includes a discal stem 11, and a cap 15 having an annular bottom flange 15a hermetically mounted on the stem. The cap has a transparent window plate 16 (e.g. glass plate) for laser beam output. Both of the stem and the cap are made of a suitable metal such as carbon steel.

The upper surface of the stem 11 is integrally formed with a mounting block 12 projecting into the cap 15. A semiconductor substrate (submount) 14, which itself is provided with a photodiode 19 (see FIG. 3) for laser emission monitoring according to the illustrated embodiment, is attached to one surface of the mounting block 12. Further, a semiconductor laser chip 13 is suitably bonded to the substrate 14 in a manner such that the optical axis of the laser chip 13 is located centrally of the cap 15. The laser chip 13 has a front cleavage plane 13a directed toward the window plate 16, and a rear cleavage plane 13b directed toward the photodiode 19.

The lower surface of the stem 11 is welded to a first lead 17a into electrical conduction therewith. Further, the stem is formed with lead inserting holes 11a for allowing entry of second and third leads 17b, 17c into the cap 15. The second and third leads 17b, 17c are insulated from and fixed to the stem by insulating glass sealant 18 (FIG. 2) loaded into the respective lead inserting holes 11a.

Figure 2:
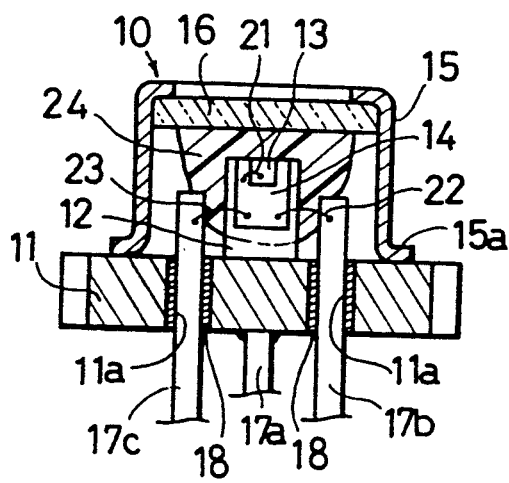
FIG. 2 is a sectional view taken along lines II—II in FIG. 1.

As shown in FIG. 2, the laser chip 13 is connected to the substrate 14 by a wire 21, while the substrate 14 is connected to the second lead 17b by another wire 22. Similarly, the third lead 17c is connected to the photodiode 19 on the substrate 14 by a further wire 23. The respective wires 21, 22, 23 may be made of a suitable metal such as gold.

Figure 3:
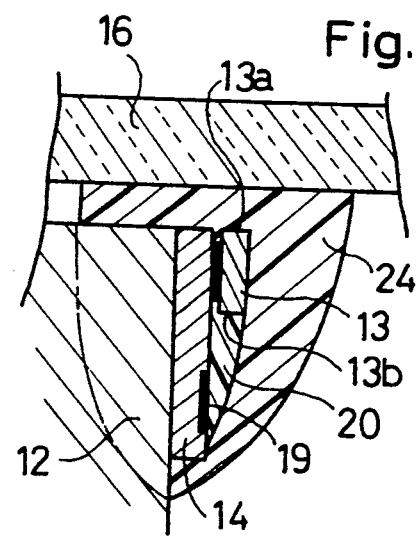
FIG. 3 is an enlarged fragmentary sectional view showing principal parts of the same laser device.

According to the illustrated embodiment, a wave guide 20 made of transparent or semitransparent synthetic resin is deposited to extend between the photodiode 19 and the rear cleavage plane 13b of the laser chip 13, as shown in FIG. 3. This wave guide functions to direct a monitoring laser beam emitted from the rear cleavage plane 13b of the chip toward the photodiode.

Further, according to the illustrated embodiment, a transparent protective body 24 is formed within the cap 15 to extend between the laser chip 13 and the window plate 16. The protective body 24 is made of a relatively soft synthetic resin such as silicone resin. The protective body is required to completely cover at least the laser chip and the wave guide 20.

Figure 4:
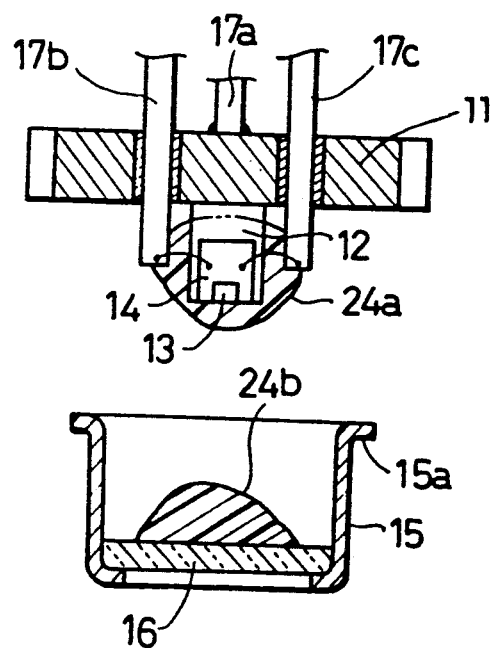
FIG. 4 is a view showing an important process step of producing the same laser device.

In assembly, the stem 11 and its associated parts are first assembled, and wire-bonding is performed. Thereafter, a resin fluid (not shown) for the wave guide 20 is deposited and cured. Subsequently, as shown in FIG. 4, a divided amount of fluid resin 24a for the protective body 24 is deposited primarily on the mounting block 12, whereas another divided amount of fluid resin 24b for the protective body is deposited on the window plate 16. Finally, the cap 15 is joined to the stem 1 to cause merging between the two fluid resin portions 24a, 24b, whereupon the cap may be hermetically joined to the stem 11 by performing resistance welding along the annular bottom flange 15a.

Alternatively, it is also conceivable to deposit an entire amount of fluid resin only on the window plate 16 instead of separately depositing the two fluid resin portions 24a, 24b respectively on the mounting block 12 and the window plate 16 (FIG. 4). However, this alternative method has the likelihood of causing foam formation (air entry) near the laser chip 13 when the mounting block 12 is later forced into the fluid resin. Thus, it is preferable to separately deposit the two fluid resin portions 24a, 24b, as shown in FIG. 4.

In operation, when a predetermined current is passed, stimulated emission of a laser beam occurs within the laser chip 13. A main portion of the laser beam is emitted from the front cleavage plane 13a (FIG. 3) of the laser chip to penetrate the window plate 16 through the transparent protective body 24. The remaining portion of the laser beam is emitted from the rear cleavage plane 13b to pass through the wave guide 20 for detection by the photodiode 19, whereby the laser emission is monitored.

With the arrangement described above, the transparent protective resin body 24 effectively prevents the laser chip 13 and the photodiode 19 from being adversely affected by moisture and/or dust getting into the cap 15. Thus, the window plate 16 itself need not be attached hermetically to the cap 15 as by using glass solder. As a result, the window plate may be attached to the cap cheaply by using a synthetic resin adhesive, thereby reducing the manufacturing cost of the laser device as a whole.

Obviously, the wave guide 20 need not be provided separately from the protective resin body 24. In this case, the protective resin body 24 serves as a wave guide for the photodiode 19.

EMBODIMENT 2

Figure 5:
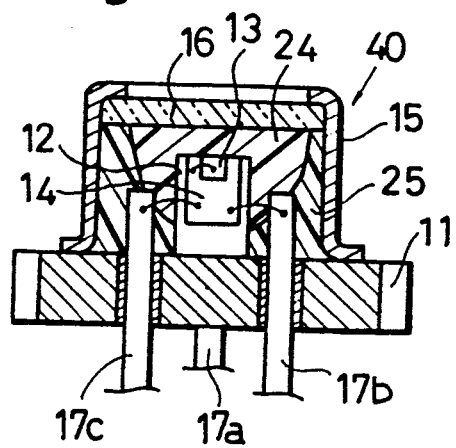
FIG. 5 is a side view, in vertical section, showing a semiconductor laser device according to a second embodiment of the present invention.

FIG. 5 shows a semiconductor laser device 40 according to the second embodiment of the present invention. The second embodiment differs from the first embodiment only in one point.

Specifically, the laser device 40 of the second embodiment additionally comprises a second protective body 25 filled within the cap 15 outside a first protective body 24. As previously described, the first protective body 24 is transparent and made of a relatively soft resin such as silicone resin. On the other hand, the second protective body 25 is made of a relatively hard resin such as epoxy resin which is thermosetting and transparent.

As long as the first protective body 24 is transparent, the second protective body 25 itself need not be transparent because it does not participate in laser beam transmission. Thus, the second protective body 25 may be made of a non-transparent or semitransparent resin.

As previously described with reference to FIG. 4, the first protective body 24 may be formed by merging of the two fluid resin portions 24a, 24b which are preliminarily deposited on the mounting block 12 and the window plate 16, respectively. Though not illustrated, the second protective body 25 may be formed for example by loading a predetermined amount of relevant fluid resin into the cap 15 over the previously deposited resin portion 24b, and subsequently mounting the cap 15 to the stem 11.

Alternatively, the second protective body 25 may be formed in situ by injecting a predetermined amount of relevant resin into the cap 15 after merging of the two fluid resin portions 24a, 24b but before welding of the cap 15 relative to the stem 15. In this case, a resin injecting nozzle (not shown) is introduced by slightly raising the cap 15 from the stem 11 to form a gap therebetween for entry of the nozzle.

The laser device 40 of the second embodiment has a double protection structure provided by the first and second protective bodies 24, 25. Thus, the laser chip 13 is more reliably protected against moisture and dust.

Further, the second protective body 25, which is made of a relatively hard resin, has sufficient strength. Thus, the cap 15 itself may be made of a weaker and lighter material such as resin, thereby realizing weight and cost reduction.

The first protective body 24 need be relatively soft. If the first protective body is made of a relatively hard resin, it may cause damage to the laser chip 13 and photodiode 19 due to expansion or contraction of the relevant fluid resin upon hardening thereof. Thus, the first protective body 24, which is relatively soft, has an additional function of protecting the sensitive semiconductor elements against mechanical damage which may be otherwise caused due to expansion or contraction upon hardening of the second protective body 24.

EMBODIMENT 3

Figure 7:
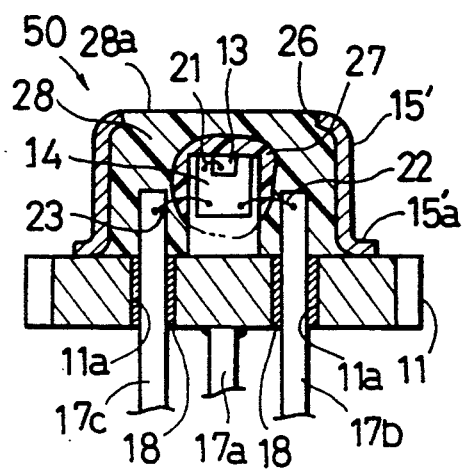
FIG. 7 is a sectional view taken along lines VII—VII in FIG. 6.
Figure 6:
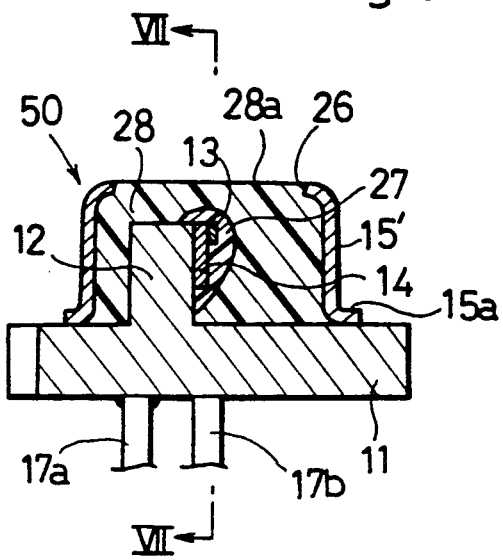
FIG. 6 is a side view, in vertical section, showing a semiconductor laser device according to a third embodiment of the present invention.
Figure 8:
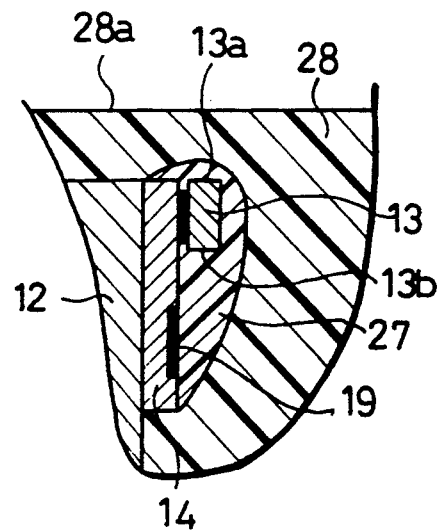
FIG. 8 is an enlarged fragmentary view illustrating principal parts of the laser device shown in FIG. 6.
Figure 20:
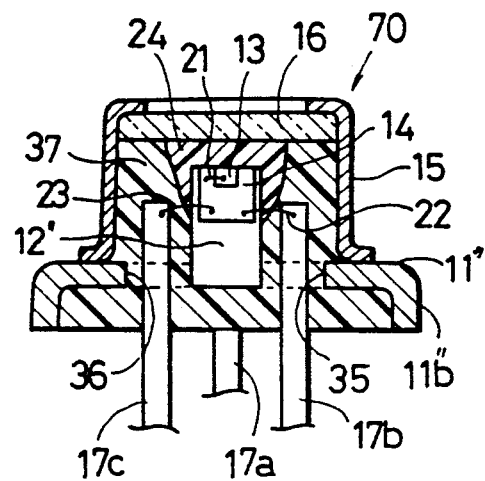
FIG. 20 is a sectional view taken along lines XX—XX in FIG. 19.

FIGS. 6 through 8 illustrate a semiconductor laser device 50 according to the third preferred embodiment of the present invention. The third embodiment is similar to the second embodiment but differs therefrom in the following respects.

The laser device 50 of the third embodiment comprises a cap 15' which itself has no window plate. Instead, the cap 15' has a window opening 26 which is left open.

The laser device 50 further comprises a first protective body 27 which is made of a relatively soft transparent resin such as silicone resin, and a second protective body 28 which is made of a relatively hard transparent resin such as epoxy resin. Because of the absence of a window plate, the second protective body 28 completely encloses the first protective body 27 and has a window portion 28a fitting in the window opening 26 of the cap 25. The outwardly directed surface of the window portion 28a is rendered smoothly flat.

Both of the first and second protective bodies 27, 28 participate in laser beam transmission. Thus, they must be equally transparent.

Figure 9:
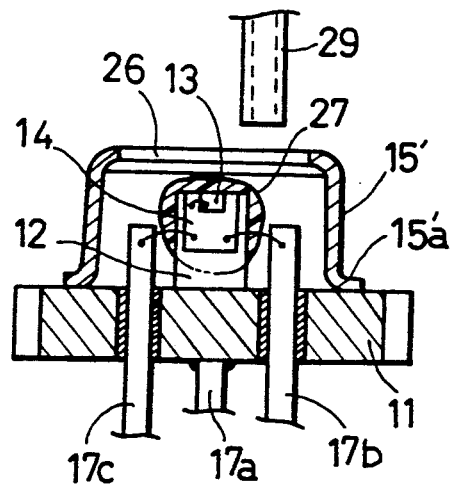
FIG. 9 is a view showing an important process step of producing the laser device of FIG. 6.

In assembly, the cap 15' may be first welded at its annular bottom flange 15a' to the stem. Then, by utilizing the window opening 26 of the cap, the first protective body 27 is formed by depositing a predetermined amount of relevant fluid resin on the mounting block 12, as shown in FIG. 9. Thereafter, the second protective body 28 is formed by injecting a predetermined amount of relevant fluid resin from an injecting nozzle 29 into the cap 15' and allowing the resin to harden, as also shown in FIG. 9.

The outwardly directed surface of the window portion 28a of the second protective body 28 may be rendered smoothly flat by pressing a releasable flat plate (not shown) immediately before the second protective body 28 is completely hardened. Alternatively, the window portion surface of the second protective body may be made smoothly flat by performing mechanical finish treatment, such as grind-polishing, after the second protective body is completely hardened.

The laser device 50 of the third embodiment has a double protection structure, so that it has the same advantages as described in connection with the second embodiment. In addition, the laser device 50 can be manufactured at a lower cost due to the absence of a separate window plate.

EMBODIMENT 4

FIGS. 10 through 12 show a semiconductor laser device 60 according to the fourth embodiment of the present invention. The fourth embodiment is similar to the third embodiment but differs therefrom only in the following respects.

The laser device 60 of the fourth embodiment comprises a stem 11' formed with lead inserting holes 11a' which are diametrically larger than those of the third embodiment. Thus, a larger clearance is formed in each hole around a corresponding lead (second or third lead 17b or 17c).

The laser device 60 further includes a resinous insulating sealant member 30 preferably made of a thermosetting resin which may contain suitable additives such as calcium carbonate, alumina, etc. The sealant member 30 has a plate portion 30a arranged on the stem 11' within the cap 15'. The sealant member further has a pair of cylindrical portions 30b fitting in the respective lead receiving holes 11a'.

In the case of using glass as sealant for the lead inserting holes (FIGS. 1 through 9), a glass pipe must be separately prepared for fitting into each hole and subsequently melted at a high temperature. The use of high temperature in turn causes metallic parts (the cap and the stem) to be thermally affected, and therefore necessitates aftertreatments such as acid-washing and plating. All these process steps increase the cost of the process.

According to the fourth embodiment, the resinous insulating sealant member 30 can be molded easily without using a high temperature treatment which may be expensive. Yet, the sealant member 30 fulfils its function of insulating the relevant leads 17b, 17c from the stem 11' in addition to reliably securing the leads relative to the stem.

The additives, such as calcium carbonate and/or alumina, contained in the sealant member 30 are effective for reducing the volumetric variation (contraction) upon hardening thereof and for decreasing the thermal expansion during operation of the laser device. Further, the additives are also effective for improving the mechanical strength of the sealant member 30. Thus, inclusion of such additives is preferable for firmly securing the leads 17b, 17c relative to the stem 11' with even higher reliability.

The laser device 60 of the fourth embodiment may be manufactured in the following manner.

First, as shown in FIG. 13, a lead frame 31 having plural groups of first to third leads 17a-17c at a predetermined pitch P is prepared. Then, each of plural stems 11' is placed relative to a corresponding lead group, so that the underside of the stem comes into contact with the upper end of the first lead 17a while the second and third leads 17b, 17c are inserted into the respective lead inserting holes 11a' of the stem (see also FIGS. 14 and 15). In this condition, the upper end of the first lead 17a is attached to the underside of the stem by performing resistance welding for example, as best shown in FIG. 14. Bonding of a semiconductor substrate 14 and a laser chip 13 relative to the mounting block 12 of the stem may be performed either before or after the stem is attached to the lead frame.

As shown in FIG. 16, after performing suitable wiring, a cap 15' is fixed to the upper surface of the stem 11'. Fixation of the cap relative to the stem may be performed for example by resistance welding.

Subsequently, a mold 32 is placed under the stem 11' in contact therewith, as shown in FIG. 17. In this condition, a resinous insulating sealant member 30 is formed in situ by injecting a suitable amount of relevant fluid resin (containing suitable additives) and causing the resin to harden.

Then, a first transparent protective body 27 is formed by depositing a suitable amount of relevant fluid resin, as shown in FIG. 18. Thereafter, a second transparent protective body 28 is formed in situ by injecting a suitable amount of relevant fluid resin and causing it to harden, as also shown in FIG. 18 (see also FIG. 9). Finally, the respective leads 17a-17c are cut off from the lead frame 31 to provide a separate laser device 60.

Molding of the resinous sealant member 30 (FIG. 17) may be performed in two steps which include a first step for injecting a first divided amount of relevant fluid resin to partially form the cylindrical portions 30b (FIG. 11) of the sealant member, and a second step for injecting a second divided amount of relevant fluid resin to complete the sealant member. Wire bonding, formation of the first protective body 27 and fixation of the cap 15' may be conducted during the interval between the first and second steps of forming the resinous sealant member 30. Further, bonding of the substrate 14 and the laser chip 13 may be also carried out in such an interval.

EMBODIMENT 5

FIGS. 19 through 23 represent a semiconductor laser device 70 according to the fifth embodiment of the present invention. The fifth embodiment is similar in general arrangement to the second embodiment shown in FIG. 5 but differs therefrom in the following points.

The laser device 70 of the fifth embodiment comprises a stem 11" which is made of a relatively thin metallic plate. The stem 11" is integrally formed with a generally rectangular mounting block 12" projecting into the cap 15. Further, the stem has an annular portion 11b" directed away from the mounting block. The mounting block may be formed in the following way.

Figure 23:
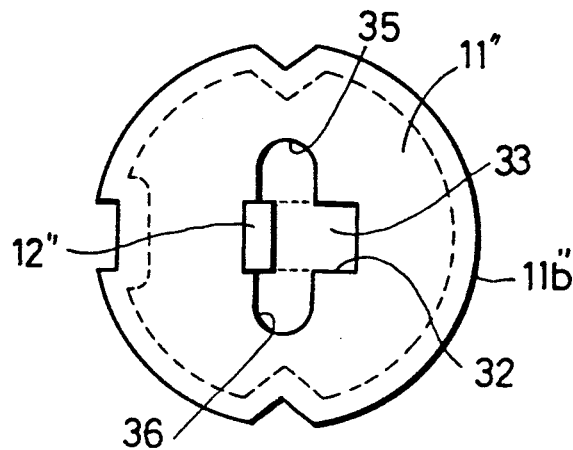
FIG. 23 is a plan view showing the same stem.

As shown in FIG. 23, a cutting line 32 extending along three sides of a rectangle is first formed in the stem 11". Subsequently, a portion of the stem located inside the cutting line 32 is bent perpendicularly in a direction away from the annular portion 11b" of the stem (see FIG. 22), consequently leaving a corresponding perforation 33 in the stem. Obviously, the thus bent portion is used as the mounting block 12".

The perforation 33 of the stem 11" has a pair of offset lead inserting portions 35, 36 on both sides of the mounting block 12". These offset portions may be replaced by a pair of circular holes (not shown) separate from the perforation 33.

A first lead 17a is attached to the stem 11" from below, whereas second and third leads 17b, 17c enters into the cap 15 through the offset lead inserting portions 35, 36, respectively, of the perforation 33. The first lead 17a may be attached to the stem in two different ways depending on the material of which the stem is made.

Figure 19:
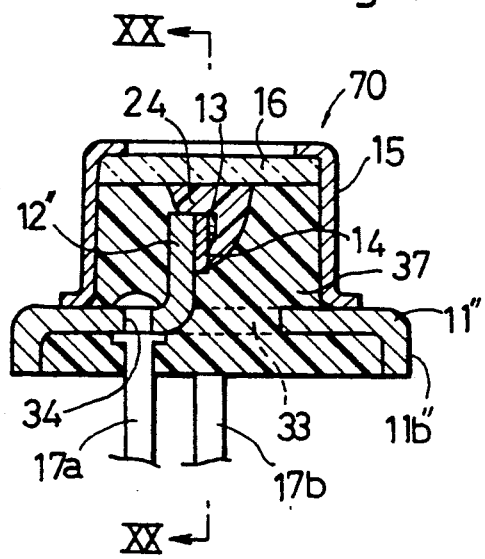
FIG. 19 is a side view, in vertical section, showing a semiconductor laser device according to a fifth embodiment of the present invention.
Figure 21:
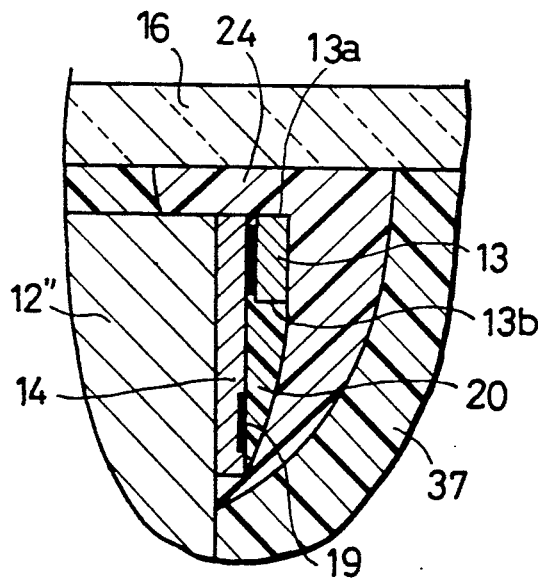
FIG. 21 is an enlarged fragmentary view illustrating principal parts of the laser device shown in FIG. 19.
Figure 22:
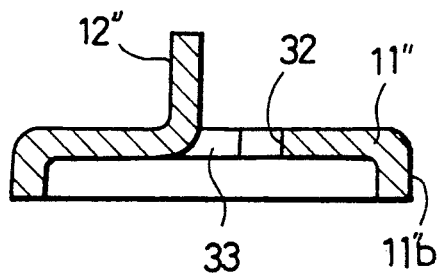
FIG. 22 is a sectional view showing a stem incorporated in the laser device of FIG. 19.

Specifically, when the stem 11" is made of carbon steel, the first lead 17a may be fixed to the stem by means of resistance welding in the same manner as described for the foregoing embodiments. On the other hand, when the stem is made of aluminum or copper, the first lead may be fixed to the stem by inserting the upper end of the lead into a mounting hole 34 of the stem and later deforming the lead upper end to clamp the stem, as shown in FIG. 19.

The laser device 70 also comprises a first protective body 24 which is substantially the same as the one shown in FIG. 5. The laser device further comprises a second protective body 37 which is made of a relatively hard resin, such as epoxy resin, optionally containing additives such as calcium carbonate and/or alumina. The second protective body 37 occupies the spaces in the cap 15, the stem perforation 33 (including the offset lead inserting portions 35, 36) and the stem annular portion 11b".

With the arrangement of the laser device described above, since the stem 11" is made of a relatively thin metallic plate, it can be formed into a predetermined shape very easily by punch-pressing. Such punch-pressing results in simultaneous formation of the mounting block 12" which is provided simply by bending a portion of the stem itself. Further, the provision of the mounting block does not result in any weight increase because the perforation 33 corresponding to the mounting block is formed in the stem.

On the other hand, the second protective body 37 penetrates into the perforation 33 and annular portion 11b" of the stem 11". Therefore, the second protective body has additional functions of closing the perforation and firmly securing the leads 17b, 17c relative to the stem in a sealed and insulated condition.

The laser device 70 of the fifth embodiment may be manufactured in the following manner.

First, as shown in FIG. 24, a lead frame 38 having plural groups of first to third leads 17a-17c at a predetermined pitch P is prepared. Then, each of plural stems 11" is placed suitably relative to a corresponding lead group. In this condition, the upper end of the first lead 17a is attached to the stem into electrical conduction, and chip bonding and wire bonding are performed. Obviously, bonding of a semiconductor substrate 14 and a laser chip 13 relative to the mounting block 12" of the stem may be performed before the stem is attached to the lead frame.

For forming a first transparent protective body 27, first and second divided amounts of relevant fluid resin 24a, 24b are deposited respectively on the mounting block 12" and the window plate 16, as shown in FIG. 25. Then, a cap 15 is attached to the stem 11" to cause merging between the two fluid resin portions 24a, 24b, as shown in FIG. 26.

Thereafter, a second transparent protective body 28 is formed by injecting a suitable amount of relevant fluid resin and causing it to harden. Resin injection is performed by utilizing the perforation 33 of the stem 11" until the resin fills the annular portion 11b" of the stem. Finally, the respective leads 17a-17c are cut off from the lead frame 31 to provide a product.

MODIFICATIONS

In any of the foregoing embodiments, the semiconductor laser chip and the photodiode are protected against moisture and dust by a single protective body or a combination of a first protective body and a second protective body. Therefore, no strict sealing requirements are imposed on the cap itself. Thus, instead of utilizing resistance welding (which is capable of realizing highly hermetical attachment), the cap, either metallic or resinous, may be attached to the stem simply by using an adhesive.

Figure 28:
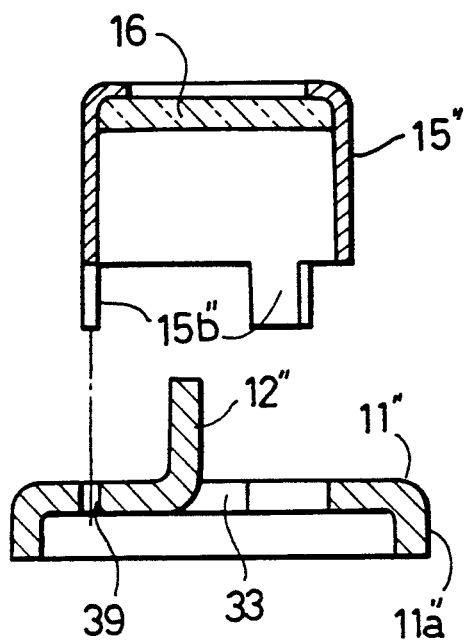
FIG. 28 is a view showing the same stem and cap before assembly.
Figure 27:
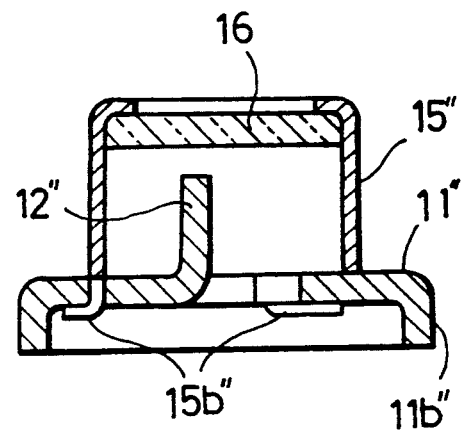
FIG. 27 is a side view, in vertical section, showing an assembly of stem and cap for a modified semiconductor laser device according to the present invention.

Alternatively, as shown in FIGS. 27 and 28, a metallic cap 15" may be used which has engaging projections 15b" for insertion into corresponding engaging holes 39 formed in the stem 11". In assembly, the engaging projections 15" of the cap are bent to engage the underside of the stem (FIG. 27).

Figure 29:
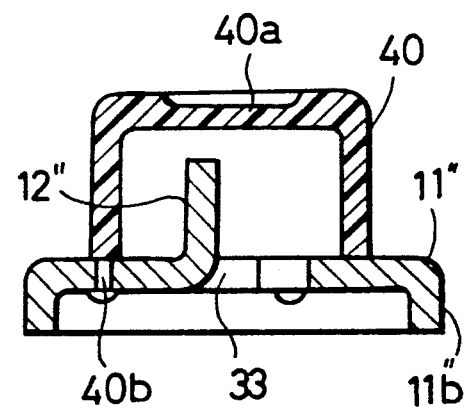
FIG. 29 is a side view, in vertical section, showing an assembly of stem and cap for another modified semiconductor laser device according to the present invention.
Figure 30:
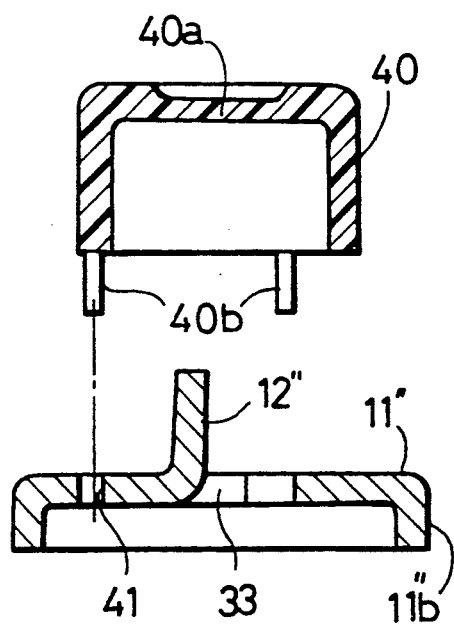
FIG. 30 is a view showing the same stem and cap before assembly.
Figure 31:
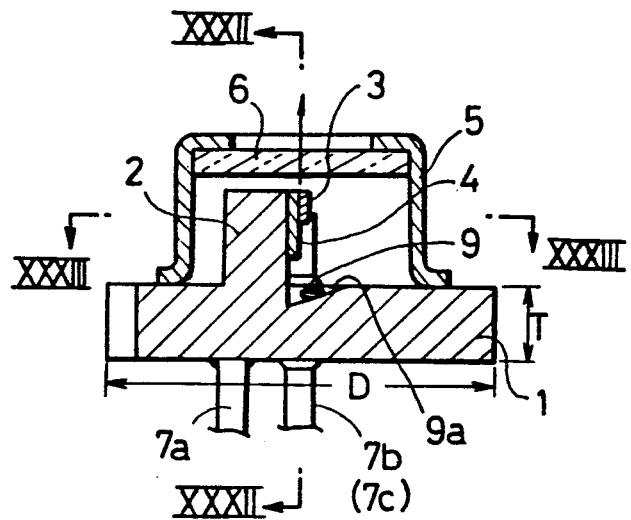
FIG. 31 is a side view, in vertical section, showing a prior art semiconductor laser device.
Figure 32:
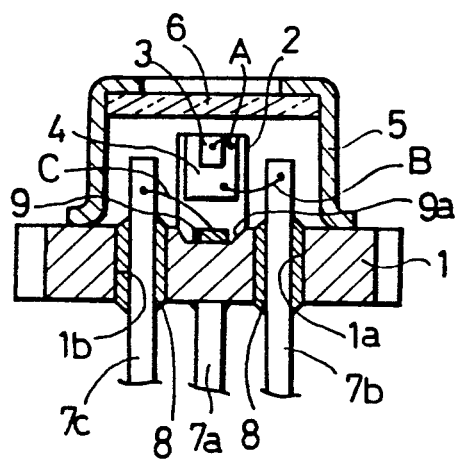
FIG. 32 is a sectional view taken along lines XXXII—XXXII in FIG. 31.
Figure 33:
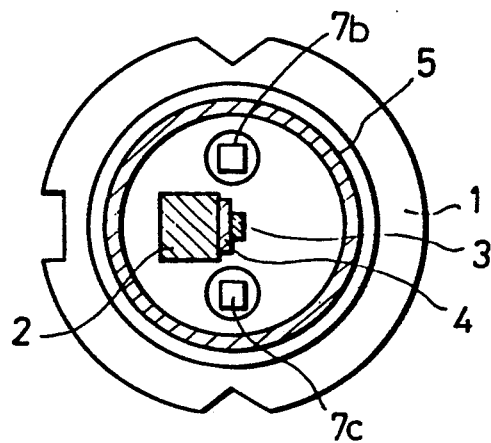
FIG. 33 is a sectional view taken along lines XXXIII—XXXIII in FIG. 31.

Further alternatively, as shown in FIGS. 29 and 30, a cap 40 may be used which is made of a transparent resin and has a thin-walled window portion 40a. The cap 40 also has anchoring projections 40b for insertion into corresponding anchoring holes 41 formed in the stem 11". In assembly, the anchoring projections 40b are thermally deformed to engage the underside of the stem (FIG. 29).

It should be appreciated that the arrangement for cap attachment shown in FIGS. 27-30 may be equally applicable to the thick-walled stem shown for example in FIG. 1.

The present invention being thus described, it is obvious that the same may be varied in many other ways. Such variations are not to be regarded as a departure from the spirit and scope of the invention, and all such modifications as would be obvious to those skilled in the art are intended to be included within the scope of the following claims.

I claim:

1. A semiconductor laser device comprising:
   a stem;
   a cap mounted to the stem;
   a semiconductor laser chip carried by the stem within the cap;
   at least one lead penetrating into the cap through a lead inserting hole of the stem; and
   an insulating sealant member made of a thermosetting synthetic resin and filling the lead inserting hole around the lead;
   wherein the sealant member contains at least one of calcium carbonate and alumina.

2. The laser device according to claim 1, wherein the sealant member has a plate portion located within the cap in contact with the stem, the sealant member further having a cylindrical portion fitted into the lead inserting hole around the lead.

3. The laser device according to claim 1, wherein the cap is made of a metallic material, the cap having engaging projections for insertion into corresponding engaging holes of the stem, the engaging projections being bent to engage the stem on the side thereof away from the cap.

4. The laser device according to claim 1, wherein the cap is made of a resinous material, the cap having anchoring projections for insertion into corresponding anchoring holes of the stem, the anchoring projections being thermally deformed to engage the stem on the side thereof away from the cap.

5. The laser device according to claim 1, further comprising a protective body arranged in the cap, the protective body being made of a transparent synthetic resin and entirely covering at least the laser chip.

6. The laser device according to claim 5, wherein the protective body is relatively soft, the laser device further comprising a second protective body which is made of a relatively hard synthetic resin, the second protective body being arranged within the cap outside the soft protective body.

7. The laser device according to claim 6, wherein the soft protective body is made of silicone resin.

8. The laser device according to claim 6, wherein the second protective body is made of epoxy resin.

9. The laser device according to claim 6, wherein the cap has a window opening in facing relation to the laser chip, the second protective body being transparent, the second protective body having a window portion fitting into the window opening of the cap.

10. The laser device according to claim 5, wherein the cap has a transparent window plate in facing relation to the laser chip, the protective body extending from the window plate toward the laser chip.

11. The laser device according to claim 5, further comprising a laser emission monitoring photodiode arranged near the laser chip, the protective body also entirely covering the photodiode.

12. The laser device according to claim 11, further comprising a wave guide extending from the laser chip to the photodiode, the wave guide being covered by the protective body.

13. A semiconductor laser device comprising:
    a stem;
    a cap mounted to the stem;
    a semiconductor laser chip carried by the stem within the cap; and
    a protective body arranged in the cap, the protective body being made of a transparent synthetic resin and entirely covering at least the laser chip;
    wherein the stem is made of a relatively thin metallic plate and integrally formed with a mounting block for carrying the laser chip, the stem being also formed with a cutting line partially surrounding a portion of the stem, the mounting block being provided by bending the partially surrounded portion into the cap to leave a corresponding perforation in the stem, the laser device further comprising a closure means for closing the perforation on the side of the stem away from the cap.

14. The laser device according to claim 13, wherein the stem has an annular portion directed away from the cap to form a closure space, the closure means comprising a body of synthetic thermosetting resin loaded in the closure space and perforation of the stem.

15. The laser device according to claim 14, wherein the protective body is relatively soft, the thermosetting resin body for the closure means having a portion filling the cap outside the soft protective body to serve as a second protective body which is relatively hard.

16. The laser device according to claim 14, wherein the perforation of the stem has at least one offset lead inserting portion through which a lead penetrates into the cap, the thermosetting resin body for the closure means serving to fix the lead at the lead inserting portion in a condition insulated from the stem.

17. The laser device according to claim 14, wherein the thermosetting resin body for the closure means is made of epoxy resin.

* * * * *